United States Patent [19]
Iwasaki et al.

[11] Patent Number: 5,910,014
[45] Date of Patent: Jun. 8, 1999

[54] METHOD OF MAKING COMPOUND SEMICONDUCTOR PHOTODETECTOR

[75] Inventors: Takashi Iwasaki; Nobuhisa Tanaka; Yasuhiro Iguchi; Naoyuki Yamabayashi, all of Osaka, Japan

[73] Assignee: Sumitomo Electric Industries, Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/589,248

[22] Filed: Jan. 23, 1996

[30] Foreign Application Priority Data

Jan. 23, 1995 [JP] Japan ..................... 7-027659

[51] Int. Cl.$^6$ ..................................................... H01L 31/18
[52] U.S. Cl. ................................ 438/94; 438/93; 438/57
[58] Field of Search ..................... 257/184, 186, 257/190, 436, 437, 438, 448, 452, 457, 459, 461; 438/48, 57, 63, 93, 94

[56] References Cited

U.S. PATENT DOCUMENTS

| | | | |
|---|---|---|---|
| 5,061,977 | 10/1991 | Funaba ................................ | 257/459 |
| 5,144,381 | 9/1992 | Furuyama et al. ...................... | 357/30 |

FOREIGN PATENT DOCUMENTS

| | | | |
|---|---|---|---|
| 0 473 197 | 3/1992 | European Pat. Off. . | |
| 62-62566 | 3/1987 | Japan ................................... | 257/184 |
| 64-23580 | 1/1989 | Japan ................................... | 257/458 |
| 4-111477 | 4/1992 | Japan ................................... | 257/437 |
| 4-111479 | 4/1992 | Japan ................................... | 257/458 |

OTHER PUBLICATIONS

J.G. Bauer et al., "Optimization of Zn dopant profiles in a pin–diode/FET by combination of depth profiling techniques: a SIMS, ECV and AES study", Applied Surface Science 50, pp. 138–142 (no month given), 1991.

Seto et al, "Fabrication of InP/InGaAs Photodiodes for High Bit Rate Communication by Reactive Ion Etching", Electronics Letters, May 23, 1991, vol. 27, No. 11, pp. 911–913.

Patent Abstracts of Japan, vol. 011, No. 249 (E–532), Aug. 13, 1987 & JP 62–062566 A (Fujitsu Ltd), Mar. 19, 1987, Nagasawa.

Patent Abstracts of Japan, vol. 007, No. 140 (E–182), Jun. 18, 1983 & JP 58–053866 A (Nippon Denki KK), Mar. 30, 1983, Tashiro.

Gotoda et al, "Selectively Embedded Growth by Chemical Beam Epitaxy for the Fabrication of InGaAs/InP Double–Heterostructure Lasers", Journal of Crystal Growth, vol. 140, Nos. 3/4, Jul. 1994, pp. 277–281.

Bauer et al, "Optimization of Zn Dopant Profiles in a Pin–Diode/FET by Combination of Depth Profiling Techniques: a SIMS, ECV, and AES Study", Applied Surface Science, vol. 50, Nos. 1–4, Jun. 1991, pp. 138–142.

Patent Abstracts of Japan, vol. 010, No. 279 (E–439), Sep. 20, 1986, & JP 61–099327 A (Fujitsu Ltd), May 17, 1986, Kagawa.

*Primary Examiner*—Charles Bowers
*Assistant Examiner*—Keith Christianson
*Attorney, Agent, or Firm*—Pillsbury Madison & Sutro LLP

[57] ABSTRACT

InGaAs photodiodes are produced on an epitaxial InP wafer having an InP substrate, epitaxially grown layers and an InGaAs light sensing layer. An insulating protection film of SixNy or SiOx with openings is selectively deposited on the epitaxial wafer. Compound semiconductor undercoats of a compound semiconductor with a narrower band gap than InP are grown on the InP window layers at the openings by utilizing the protection film as a mask. A p-type impurity from a solid source or a gas source is diffused through the undercoats and the epitaxial InP layer into the InGaAs sensing layer. Then, either p-electrodes are formed on the undercoats and the undercoats are etched by utilizing the p-electrodes as a mask, or the undercoats are shaped by selective etching in a form of p-electrodes and the p-electrodes are formed on the undercoats.

8 Claims, 10 Drawing Sheets

METHOD OF MAKING COMPOUND SEMICONDUCTOR PHOTODETECTOR

FIELD OF THE INVENTION

This invention relates to a photodetector suitable for optical communication systems based upon long wavelength light. The long wavelength as referred to herein means light having a wavelength ranging from 1.0 μm to 1.7 μm. The reason why the light is called "long wavelength" is that the light has a longer wavelength than visible light or near infrared light produced by GaAs lasers. Low loss in $SiO_2$ optical fibers enhances the value of the long wavelength light as a carrier of signals in optical communication networks.

An excellent photodetector for the long wavelength light should have not only a sufficient sensitivity to the wavelength but also should have a high speed response to the light. Acceleration of the response requires a smaller capacitance between electrodes and a smaller contact resistance at electrodes in a photodetector. This invention, in particular, proposes a photodetector suitable for the optical communication through the long wavelength light.

BACKGROUND OF THE INVENTION

This application claims the priority of Japanese Patent Application No. 27659/1995 filed Jan. 23, 1995, which is incorporated herein by reference.

InP type photodetectors for the long wavelength light, in general, have been produced by the following method. An InP wafer is prepared as a substrate crystal. An n-type InP buffer layer, an n-type InGaAs receiving layer and an n-type InP window layer are epitaxially grown on the n-type substrate. Then, an insulator layer, e.g., SixNy, is deposited as a mask on the window layer. Windows are perforated through the mask to the epitaxial layers by photolithography. P-type impurity, e.g., zinc (Zn), is thermally diffused through the opening on the InP window layer and the InGaAs receiving layer. The p-type impurity-diffused parts of the window layer and the InGaAs become a p-type region. A ring-shaped p-side electrode is formed on the p-type region. The opening encircled by the p-side electrode becomes an area which receives light beams. An n-side electrode is formed on the n-type InP substrate. An antireflection film is deposited on the light receiving area for heightening the sensitivity. These processes are called "wafer process". Then, the wafer is sliced lengthwise and crosswise along cleavage lines into a plurality of individual photodiode chips.

The wafer having an n-type InP substrate, an n-InP buffer layer, an n-InGaAs receiving layer and an n-InP window layer before the formation of electrodes is sometimes called an "epitaxial wafer" or an "epitaxial crystal". The region which has been doped with the p-type impurity is named a p-region. The p-region has a dish-like section. The doping of the p-type impurity converts a part of n-type layer into p-type region. The boundary between the p-region and the n-region is called a pn-junction.

The InGaAs light receiving layer has a smaller band gap Eg 1 (width of the forbidden band) than InP whose band gap is denoted by Eg2. Namely, Eg1<Eg2. A semiconductor absorbs photons (quanta of light), when the semiconductor has a smaller band gap Eg than the photon energy h v. If light having energy bigger than Eg1 but smaller than Eg2 enters the above InGaAs photodiode (Eg1<h v<Eg2), the InP (Eg2) is transparent to the light (h v) but the InGaAs (Eg1) layer absorbs and detects the light.

Therefore, the InP layer above the InGaAs receiving layer (absorbing layer) acts as an window which does not hinder the light from penetrating into the inner layer without loss.

The electrode which is formed in an ohmic contact on the p-type region is a ring-shaped electrode. Then, light enters the central part enclosed by the ring electrode. Thus, the electrode on the p-region is called an "annular electrode", or a "ring electrode". The same electrode is often called a "p-side electrode" or "p-electrode".

A flat wide n-electrode is formed on the bottom side of the n-InP substrate. If the substrate is semi-insulating, an n-electrode is sometimes formed partially on an n-region of an epitaxial crystal. Both the p-electrode and the n-electrode are ohmic electrodes which have an ohmic contact with the underlying layer or substrate.

The antireflection film is made from SixNy (which is often represented in brief as SiN by omitting suffixes x and y) or $SiO_2$ or other transparent dielectrics. The antireflection film which scarcely reflects incident light can be fabricated by selecting pertinent reflection ratio of the film. The part outside of the annular electrode is also covered with a dielectric film.

Such a structure is generally employed for making photodiodes. In use, the n-electrode and the p-electrode are reversely biased. A depletion layer is yielded on the pn-junction. The applied bias generates an electric field which is directed from the n-type region to the p-type region. The light receiving region enclosed by the annular p-electrode is irradiated by light beams which have emanated from an optical fiber and have converged on the photodiode via a lens. The light beams pass through the window layer without loss and arrive at the InGaAs receiving layer. The light generates pairs of electrons and holes. Electrons make their way to the n-electrode and holes progress to the p-electrode. The flow of the electrons and the holes is called a photocurrent. The photocurrent is in proportion to the power of the incident light.

For example, Japanese Patent Laying Open No.4-111477 (111477/'92) describes a method of producing such a photodiode. The proposed photodiode has a wide p-region which extends beyond the annular p-electrode for suppressing stray light reaching outside of the annular electrode from yielding a retarded photocurrent. In the device, the holes which have been generated outside of the p-electrode cannot cross over the pn-junction and cannot reach the p-electrode. Thus, no retarded photocurrent is induced.

Another important problem is the coating of the peripheral part outside of the annular electrode. The peripheral part of the window layer is coated with an insulating layer. The insulating layer has the role of protecting the InP crystal from chemical reaction and contamination. The insulating layer is called a "passivation film". SixNy, SiOx or other dielectrics are employed for making passivation films. SiN (suffixes x and y are omitted), in particular, is excellent in cohesion to InP crystals.

It is undesirable for light beams to enter the peripheral region outside of the annular electrode. For example, Japanese Patent Laying Open No.64-23580 provides an InGaAs absorbing layer around the p-annular electrode of a photodiode. The peripheral InGaAs layer absorbs the light which arrives at the periphery. Thus, no light enters into the outside region of the photodiode.

Shortening the time of response requires low resistance at electrodes. The resistance between the electrode and the semiconductor is called an "electrode resistance" or a "contact resistance". There is no problem for the n-electrode which is formed on the n-region, since the contact resistance is low enough because of the wide contact area and the high impurity concentration at the n-electrode.

A problem accompanies the p-side electrode, since a narrow contact area has a tendency of raising the electrode resistance. When a p-electrode is formed directly on the p-region, the resistance cannot be reduced below a certain value, no matter what low-resistant material is utilized to build p-electrodes. Fabrication of lower contact resistant p-electrodes requires some contrivance other than the selection of the electrode material.

Japanese Patent Laying Open No. 62-62566 proposes an improvement of forming an undercoating layer of InGaAs for reducing the contact resistance of p-electrodes. The contact resistance should be decreased by forming an InGaAs undercoating layer on the p-InP layer and depositing a p-electrode on the undercoating layer. Namely, No.62-62566 makes a p-electrode of Ti/Pt/Au or Cr/Au on an InGaAs undercoating layer which has been deposited on the p-InP layer.

Why is InGaAs pertinent to the undercoating for ohmic p-electrodes? The difference of work functions between InGaAs and the p-electrode metal is smaller than the difference between InP and the electrode metal. A smaller difference of work functions ensures the electrodes a lower contact resistance. This is one reason for the excellence of InGaAs as an undercoating material. InGaAs crystals can contain higher density of impurity than InP crystals at the interfaces between a metal and a semiconductor. The high density of impurity enables p-electrodes to reduce the contact resistance.

The InGaAs of the light receiving layer must not be confused with the InGaAs of the undercoating. The InGaAs receiving layer has been formed in an epitaxial wafer. An electric field can be built in the InGaAs receiving layer for inducing a photocurrent by an incidence of photons, since the InGaAs layer has a small density of impurity and a high resistance. The InGaAs layer makes better use of the narrower band gap than that of InP for sensing photons.

On the other hand the undercoat InGaAs layer is highly doped with impurity. The undercoat InGaAs takes advantage of the low difference of the work functions between the metal and InGaAs, the high carrier density and the low resistance for leading currents.

A new problem arises from the use of the same material for accomplishing these two different objects. The light which should be detected by the InGaAs photodetector has a energy h v which is smaller than the InP band gap Eg2 but bigger than the InGaAs band gap Eg1. Namely, Eg1<h v<Eg2. InGaAs is not transparent to the light, because Eg1<h v. InGaAs can absorb the light. If the undercoat InGaAs layer extends beyond the p-electrode, the extending parts will partially shield the receiving area from the incidence of the light. The existence of the projecting parts is undesirable, since the projecting parts absorb a part of the entering light and attenuate the power. Thus, it is preferable to equalize the breadth of the undercoat InGaAs to the breadth of the p-electrode and to suppress the under coat InGaAs layer from expanding out from the beneath the p-electrode. But it is very difficult.

PROBLEMS TO BE SOLVED

Rapid-response devices demand a small resistance and a small capacitance at the electrodes. The resistance at the electrodes can be reduced by undercoating an InGaAs layer beneath the p-electrode, which has been already mentioned. If there are parts of the InGaAs extending out below the electrode, the extending InGaAs parts must be eliminated from the surface of the InP. Otherwise, the projecting undercoat would absorb a part of the light which has a wavelength between 1.0 μm and 1.7 μm which is suitable for optical fiber communication systems. The absorption of the signal light would decrease the sensitivity. A further contrivance is required for forbidding the InGaAs undercoat from protruding out of the p-electrode.

By contrast, the reduction of the electrostatic capacitance of a photodiode will be accomplished by the following two ways of:

① decreasing the capacitances among the inner crystal layers, and

② narrowing the receiving area.

Heightening the purity of the depletion layer is effective to ①, since the reduction of impurity increases the effective thickness of the depletion layer and decreases the capacitance. Effective means for ② is a reduction of the area of the depletion region just below the receiving region. The narrowing of the depletion region decreases the capacitance. Nevertheless, there is a limit to reducing the area of the depletion region for the following reasons. One reason is that the beams emanating from an optical fiber have a wide sectional area which demands a wide depletion region. The other reason is that wirebonding requires a certain area of electrode pads. For these reasons, the area of the p-region is in general, wider than the area of the part which actually receives light.

FIG. 1, FIG. 2, FIG. 5 and FIG. 6 illustrate structures of conventional photodiodes. FIG. 1 shows a photodiode having a wide receiving region whose diameter is larger than 200 μm. FIG. 2 is the plan view of the same. In FIG. 1 or FIG. 5, an n-type semiconductor substrate (1) means an assembly of an n-type InP substrate, an n-type InP buffer layer, an InGaAs light receiving layer and an InP window layer. Such n-type semiconductor crystals are on sale as epitaxial wafers. The method of fabricating the epitaxial wafers is well known. This invention takes such an epitaxial wafer as a starting material, since the wafers are made and sold by wafer makers. Photodiodes will be made on an epitaxial wafer.

Many of photodetectors are made on a wafer. The figures show a structure of a single device. A photodiode has a p-region (2) at the center on the top surface of the epitaxial wafer. A protecting film (3) covers the periphery of the top surface. The protecting film is made of, e.g., SiOx, SixNy or other dielectrics. The protecting film partially overlaps the outer portion of the p-region (2). The central part of the p-region plays the role of light receiving area. An annular undercoat crystal (4) is deposited on the outer part of the p-region (2). A circular p-electrode (5) is formed on the undercoat crystal (4). The p-electrode extends outward partially. The extending portion (F) is made for wirebonding. A wire will be bonded on the extending portion (F).

The area which effectively senses light beams is only the central part (H) of the p-region (2). No light enters the annular part which is covered with the p-electrode (5) of course. The loss by the electrode is unavoidable. Since the undercoat crystal (4) is wider than the p-electrode (5), peripheries (J) and (K) of the undercoat project on both sides from the p-electrode. The peripheries (J) and (K) appear uncovered in the plan view of FIG. 2. Since the mask alignment is difficult, the size of the undercoat is determined with wide margins to the size of the p-electrode. The wide margins cause inevitably such peripheries (J) and (K) of the undercoat layer. The area of the receiving region is reduced by the peripheries (J) and (K). The loss of receiving area due to the margins is one problem for the conventional diode having the undercoat.

A more fatal drawback incurs from the circular gap (L) which is defined between the protecting film (3) and the annular electrode/undercoat. The occurrence of the gap (L) is unavoidable, since the photodiode is produced by the steps of removing a central part of a chip unit of the protecting film formed on an epitaxial wafer, diffusing p-type impurity atoms through the opening to the light receiving layer, forming the undercoating layer on the opening, eliminating a central part of the undercoating layer for leaving an annular undercoat crystal and depositing an annular p-electrode. The gap (L) is also an ineffective area for receiving light beams. Although the width is small, the total area of the gap (L) is considerably wide, because the circumference is long enough. The p-region includes ineffective parts (J), (K) and (L) besides the effective light receiving portion (H).

More rapid response requires a smaller electrostatic capacitance at the depletion layer and a narrower p-region. The sensitivity, however, is raised in proportion to the light receiving area. Wide ineffective parts (J), (K) and (L) degrade the performance of a photodiode, because the parts increase the capacitance but reduce the sensitivity.

High cost of production is another problem of the conventional photodetector with the undercoat, since the undercoat raises the number of the steps of fabrication. The wafer process includes the steps of removing a central part of the protection film in a unit, making an opening at the center, diffusing impurity through the opening into the window layer and the receiving layer, growing an undercoat layer in the opening, eliminating a central part of the undercoat by photolithography making an annular undercoat layer and making a circular electrode on the undercoat by photolithograpy.

FIG. 5 and FIG. 6 denote a smaller photodiode having a narrower receiving layer whose diameter is less than 200 $\mu$m. The p-region is so narrow that no annular electrode can be formed on the p-region. A round p-electrode (5) is formed on an round undercoat (4) at an extension of the p-region. In this case, a gap (L) remains between the round electrode and the protective layer (3). The gap is inevitably produced in the steps of wafer process because of the difficulty of the mask alignment. Furthermore, a margin (K) is yielded on the periphery of the undercoat (4), because the undercoat (4) is wider than the electrode (5). Only a restricted area acts as a light receiving part (H) in the p-region.

An improvement may be contrived hypothetically for solving the above discussed problems. The hypothetical method may include the steps of forming an InGaAs contact layer further on the InP window layer of the epitaxial wafer, depositing an insulating film of, e.g., SiN on the InGaAs layer, eliminating a central part of a unit of the insulating film, diffusing impurity atoms through the InGaAs, making a p-electrode on the InGaAs layer and eliminating the central part of the electrode and the InGaAs layer. Then, the device would have a layered structure of SiN/InGaAs/InP (from top to bottom) overall. There would be no gap between the protection film and the undercoat, since the protective layer would ride on the inner portion of the InGaAs layer. There would be no margin of the under coat beneath the p-electrode, because the undercoat and the electrode metal would be etched at the same time. This hypothetical method has a fatal weak point. The passivation film SiN would cover the InGaAs layer in the case. But the passivation of SiN formed on InGaAs is far more unstable than the passivation of SiN on InP. The passivation of SiN is not congenial to InGaAs. The SiN film formed on InGaAs cannot fully protect the underlying layers. The passivation SiN/InGaAs is not desirable.

The passivation should still be constructed by the traditional pair of InP and SiN. Namely, the request of the passivation denies the hypothetical improvement based upon the overall InGaAs contact layer. If both the SiN/InP passivation and the InGaAs undercoat were adopted, the undercoating InGaAs layer should be preparatively deposited on the part on which the p-electrode will be formed. The undercoat InGaAs must not be formed on a part except the part for the electrode. The InGaAs layer should be selectively formed from the beginning. However, such a selective formation of the InGaAs layer would increase the number of steps and the cost of production. In addition, the low preciseness of the current mask alignment would increase the size of the Zn-diffusion region. The increment of the Zn-diffusion region would raise the electrostatic capacitance, which would delay the response of the photodiode.

Therefore, if the ohmic property of the electrode were improved by inserting the undercoat which reduces the contact resistance, the cost and the capacitance would be increased by the undercoating layer. It is difficult to harmonize the requirement of a low contact resistance with a small capacitance and a low cost.

One purpose of the present invention is to provide a compound semiconductor photodiode having a small capacitance and a low resistance. Another purpose is to provide a compound semiconductor photodiode excellent both in the response and in the sensitivity. A further object of the present invention is to provide a method of producing the semiconductor photodiode without raising the cost.

SUMMARY OF THE INVENTION

The Inventors think that the best structure of a photodiode should have an InGaAs undercoat layer which is in contact with the protecting layer. Namely, the photodiode proposed by this invention is a photodiode which could be obtained by eliminating the circular gap (L) and the margin (K) from the photodiodes shown in FIG. 1, FIG. 2, FIG. 5 or FIG. 6. The conventional method cannot make such a photodiode which is immune from the gap and the margin, as already explained. Then, the Inventors have contrived to produce such a new structure of a photodiode having the undercoat.

The method of the present invention is the same as the conventional one, for example, Japanese Patent Laying Open No.4-111479, until the steps involving the mask process for impurity diffusion. The starting wafer can be either an n-type InP wafer or a semi-insulating InP wafer. In the case of employing an n-type InP as a starting substrate, it is convenient to use an epitaxial wafer having an n-InP substrate, an InP buffer layer, an InGaAs light receiving layer and an InP window layer. The method includes the steps of depositing an SIN film on the InP window layer and perforating holes which are openings for zinc-diffusion and define the region on which p-electrodes will be formed.

In the case of employing a semi-insulating InP substrate as a starting substrate, it is preferable to adopt an epitaxial wafer having a semi-insulating InP substrate, an$^+$-InP layer, an n$^-$-InP layer, an InGaAs receiving layer and an InP window layer. The method of production is similar to the case of the n-type epitaxial wafer. An SiN film is deposited on the window layer of the wafer and holes are perforated for making openings for diffusing zinc and for giving the area on which p-electrodes are formed.

The conventional method has diffused zinc through the openings into the InP window layer and the InGaAs receiving layer by supplying a zinc-containing gas on the wafer, bringing the Zn-containing gas into direct contact with the InP window layer and making zinc atoms to diffuse via the vapor/solid interface into the InP window layer.

Such a vapor phase diffusion is also available for making the photodiode of the present invention. There is, however, a more suitable diffusion method. It involves diffusion from solid phase. This invention can be realized both by the vapor phase diffusion and by the solid phase diffusion. Since the latter is not well known yet, the diffusion from solid phase is now explained. The solid-phase diffusion makes the best use of the fact that the InGaAs crystal does not grow on the SiN film but grows on the InP window layer. SiN excludes InGaAs and suppresses InGaAs crystals from growing on it. This is an important property of SiN. However, InP allows InGaAs to deposit thereon. The SiN film has been formed selectively on the InP window layer as the protection film.

The solid-phase diffusion method firstly deposits a Zn-free InGaAs layer of a predetermined thickness on the portions of the InP window layer appearing from the openings of the SiN mask. InGaAs does not pile on the SiN mask. Namely, the SiN film plays not only the role of the mask for Zn-diffusion but also the role of the mask for InGaAs-selective growth. This invention thus takes advantage of the SiN film in two manners. The InGaAs layer is in contact with the sides of the SiN film. There is no gap between the SiN film and the InGaAs layer. Since the InGaAs is grown on the InP layer with the SiN mask, the InGaAs crystal fills the openings on the InP enclosed by the SiN. No gaps like (L) of FIG. 1 or FIG. 2 occur between the SiN and the InGaAs. Thus, any portions on the epitaxial wafer are fully covered with either SiN or InGaAs. There remains no portion which is covered with nothing on the epitaxial wafer. Here the covering InGaAs is free from Zn.

Then, Zn is diffused from a Zn-source through the covering InGaAs layer into the epitaxial wafer. The SiN shields the Zn flow. The Zn-source can be either a solid source or a gas source. Instead of zinc (Zn), Cd, Mg or Be can be adopted as a p-type impurity. In the description, zinc is employed as a p-impurity.

In the case of a solid source of zinc, the solid Zn-source should be grown on the Zn-free InGaAs layer before diffusion. This invention prefers a solid source to a vapor source. The solid source of zinc is, for example, ①  InP(Zn),
②  InAsP(Zn) or
③  InGaAsP(Zn).

The bracketed (Zn) denotes that the former material includes Zn. These candidates for the Zn-source include phosphorus. The reason why the solid source should include phosphorus will be mentioned below. ① means a InP which is doped with zinc (Zn). This is the simplest material and is feasible to grow on the InGaAs layer. ② or ③ is another candidate which can refrain arsenic (As) from dissolving out of the undercoat InGaAs layer.

In the case of a gas source of zinc, the gas source should be

④ a gas including As, P and Zn. The zinc is thermally diffused by
supplying the gas ④ to the epitaxial wafer having the InGaAs covering layer.

When the solid source ①, ② or ③ is deposited on the InGaAs, the wafer has a layered structure of InP(Zn)/InGaAs/epi-wafer from top to bottom. Heat drives zinc atoms from the top InP layer to the boundary between the InP and the InGaAs layer. The zinc atoms further diffuse to the InGaAs. Then, zinc atoms attain to the interface between the InGaAs covering layer and the epitaxial wafer. The zinc atoms make their way to the middle of the InGaAs light receiving layer. The length of the diffusion along the thickness of the InGaAs light receiving layer can be controlled by the temperature and the time of diffusion. Unlike the conventional method, zinc atoms have passed two solid layers and two interfaces until they attain to the surface of the epitaxial wafer. Then, substantial diffusion starts for making the dish-shaped p-region in the InP window layer and the InGaAs light sensing layer of the epitaxial wafer.

When the gas source ④ is used, the diffusion takes place under the relation of (As, P and Zn)-containing gas/InGaAs/epi-wafer. The zinc atoms penetrate first the InGaAs layer and pass through the layer by the thermal diffusion. Then, the impurity atoms reach the interface and cross over the interface. Further, the zinc atoms diffuse in the InP window layer and the InGaAs of the epitaxial wafer and convert the region from n-type to p-type conduction.

In any cases, this invention conspicuously differs from the conventional method at the point that the impurity atoms have passed through the InGaAs covering layer by the thermal diffusion until the atoms attain to the surface of the epitaxial wafer. Then, the p-impurity atoms can be diffused into the epitaxial wafer via the covering InGaAs layer which acts as a filter of diffusion.

Then, p-electrodes are formed on the InGaAs covering layer which has accomplished the role of diffusion filter. There are two ways for making p-electrodes on the InGaAs. ① The first way makes the p-electrodes by the steps of coating the InGaAs layer with a p-electrode material, eliminating unnecessary portions by photolithography, forming annular or round p-electrodes and etching the InGaAs undercoat by an etchant which is inactive to the electrodes. Since the InGaAs undercoat is etched by using the p-electrodes as a mask, the sides of the InGaAs rigorously coincide with the sides of the p-electrodes. The etching does not leave such gaps (J) and (K) which appear in FIG. 1, FIG. 2, FIG. 5 and FIG. 6 owing to the self-alignment of the etching.
② The second way produces the p-electrodes by the steps of etching the InGaAs layer selectively by photolithography into an annular shape or a round shape, depositing p-electrode material on the surfaces of the InGaAs and the InP except the surfaces of SiN, eliminating unnecessary portions of p-electrode material and forming annular or round p-electrodes on the InGaAs undercoats. The second way, however, has drawbacks of increasing the number of production steps and of leaving small gaps (J) or (K) on the inner sides due to the necessity of allocating margins on the InGaAs undercoat.

What is important is the fact that parts of the InGaAs layers which act as filter layers of zinc diffusion become undercoats of p-electrodes, as they are. Since the InGaAs layers have been grown on the openings of the InP enclosed by the SiN as a mask, no gaps (L) occur between the SiN and the InGaAs. This invention adopts the InGaAs layer as a diffusion filter of zinc, since the InGaAs can serve as undercoats of p-electrodes. This is one of the sophisticated features of this invention.

The functions, significance or advantages of the invention will be clarified.

The present invention includes the steps of covering the parts which shall not be doped with impurity with the insulation films which refrain the impurity from diffusing and covering the rest, which requires impurity doping, with InGaAs crystals. This is one of novel matters. The InGaAs layers protect the epitaxial wafer by preventing phosphorus (P) from dissociating out of the epitaxial wafer, even when the wafer is heated.

Furthermore, the diffusion through the solid layer reduces the speed of diffusion. Slow diffusion realizes a fine control of the Zn-concentration and the depth of the p-region through subtle adjustments.

This invention makes the best use of the diffusion-mask insulator (e.g.,SiN) as the mask for growing an undercoat crystal (e.g., InGaAs) selectively on the epitaxial wafer. The same mask is commonly used both in the diffusion process and in the undercoat-growth process. Since there is no need for making two different masks for the diffusion and the undercoat-growth, the common use of the mask simplifies the steps of production. This is one of the advantages of the invention.

The undercoat crystal InGaAs is grown on the wafer which has partially been covered with the SiN film which suppresses InGaAs from depositing thereon. The InGaAs layer can be grown in tight contact with the SiN film in the horizontal direction. There remains no gaps between the insulator (SiN) and the undercoat (InGaAs) which are depicted in FIG. 1, FIG. 2, FIG. 5 or FIG. 6. Thus, if the p-electrodes have the same area, the tight contact structure can raise the area of the light receiving regions. The wider light receiving regions enable photodiodes to acquire higher sensitivity.

If the photodiode has the same area of the sensing region as a conventional photodiode, this invention has an advantage of raising the speed of the response by reducing the area of the p-region and decreasing the electrostatic capacitance.

The reason that non-doped InGaAs is deposited on the epitaxial wafer as an undercoat is explained. First, it is desirable to apply phosphorus (P) pressure to the wafer in order to control the distribution of the p-type impurity (e.g., Zn) in the direction of the thickness. Without the sufficient partial pressure of phosphorus, the vertical distribution of Zn-density cannot be precisely adjusted. If phosphorus (P) were supplied to the wafer during the growth of the InGaAs layer, an InGaAsP crystal would be unavoidably grown instead of an InGaAs. If InGaAsP were allocated as the undercoating layer, the contact resistance would be too large, because InGaAsP hinders p-impurity from diffusing. Then, P-partial pressure cannot be applied to the wafer during the growth of the undercoat layer. Without P-pressure, the distribution of Zn cannot be controlled. Thus, the undercoating InGaAs must be grown without doping with zinc (Zn). The InGaAs undercoat layer without P is an important requirement both for the electrode formation and for the zinc diffusion.

Then, a solid impurity source is piled on the undercoat InGaAs. The solid impurity source is a semiconductor including phosphorus (P), for example, InP(Zn), InAsP(Zn) or InGaAsP(Zn), because phosphorus plays an important role of controlling the profile of Zn diffusion in the vertical direction.

In the case of diffusing zinc from vapor phase, it is also desirable to make use of an atmosphere including phosphorus (P) and arsenic (As). Japanese Patent Laying Open No. 2-24369 asserts that when $ZnP_2$ gas is adopted as a zinc diffusion source, the P-partial pressure has a serious influence upon the diffusion. It proposes an improvement of the close-tube method which is not suitable for large sized wafers.

Advantages of the present invention are explained now. No extra gaps or margins occur between the undercoating layers and the insulating protecting films of SiOx or SixNy, because this invention selectively covers the epitaxial wafer with the protecting film with openings and grows InGaAs layers selectively on revealed InP window layer in the openings by making the best use of the protecting film as a mask.

The p-impurity is diffused from a solid diffusion source or a gas source through the undercoats into the InGaAs sensing layer. The undercoats protect the epitaxial crystals by prohibiting phosphor (P) from escaping out of the InP crystals. The undercoat layers maintain the stoichiometry of the InP near the surface. The surface of the InP is immune from being rough. If the a solid diffusion source is employed, the escape of P and As is forbidden completely.

The protection film plays two roles of a mask of the impurity diffusion and of a mask of restricting the scope of the undercoat growth. The dual role of the protection film enables this invention to omit one mask and one process of photolithography.

If the undercoats are eliminated after the p-electrodes have been formed, the p-electrodes act as a mask for etching of the undercoats. The sides of the undercoats coincide with the sides of the p-electrodes. Neither steps nor margins appear on the undercoats, which further curtails the area of unnecessary p-regions. Moreover, this invention can dispense with one mask and one process of photolithography.

The InGaAs contact (undercoating) layers are rigorously restricted beneath the p-electrodes. The passivation films are in contact with the InP layer. The passivation with InP is superior to the passivation with InGaAs. The passivation of SiN/InP suppresses the dark current.

Instead of depositing p-electrodes directly on the InP, the p-electrodes are formed on the undercoats which have grown on the InP. The insertion of the undercoats reduces the contact resistance of the p-electrodes and makes good ohmic contacts.

This invention can alleviate the cost of production by reducing the number of masking processes and simplifying the steps of fabrication.

Furthermore, this invention raises the ratio of the effective sensing area to the entire p-region. If the sensitivity is kept to be the same as that of the conventional one, the capacitance can be reduced, which improves the response speed. If the electric capacitance is kept to be the same, the sensitivity can be enhanced. This invention is capable of being applied both to an epitaxial wafer of an n-type InP substrate and to an epitaxial wafer of a semi-insulating InP substrate.

DETAILED DESCRIPTION OF THE PREFERRED EMBODIMENTS

Photodiodes are produced upon epitaxial InP wafers according to the teaching of the present invention. The steps of production are similar to the conventional one, for example, Japanese Patent Laying Open No. 4-111479, until the process of making the mask for diffusion. This invention, however, includes the steps of growing InGaAs layers on the parts without the mask of the epitaxial wafer, growing solid impurity sources upon the InGaAs layers and diffusing zinc atoms from the solid source through the InGaAs layer into the epitaxial wafer. The embodiments employ the chloride vapor phase method for depositing the undercoat InGaAs and the impurity sources. Although the embodiments diffuse zinc as the p-impurity, it is a matter of course that Cd, Mg or Be can be used as the p-impurity instead of zinc.

[Embodiment ① (small sensing area type using an n-type epitaxial InP wafer)]

This invention produces a photodiode by two different ways on an epitaxial wafer having layers on an n-type InP substrate. The two ways are shown in a set of FIG. 9 to FIG. 15 and a set of FIG. 16 to FIG. 21. FIG. 9 to FIG. 15 demonstrate the steps of eliminating parts of InGaAs layers by masking InGaAs with the p-electrodes themselves. The p-electrodes act as the masks for etching the InGaAs undercoats. FIG. 16 to FIG. 21 show the steps of eliminating parts of InGaAs layers and depositing p-electrodes on the remaining InGaAs layers. Both of the two ways are the same in the first four steps of FIG. 9–FIG. 12 and FIG. 16–FIG. 19.

Figure 9:
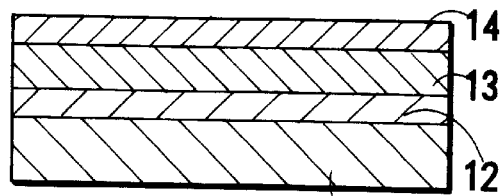
FIG. 9 is a sectional view of a unit of an epitaxial wafer having an n-InP substrate as a starting material of the wafer process for making a first embodiment by a first embodiment method.
Figure 10:
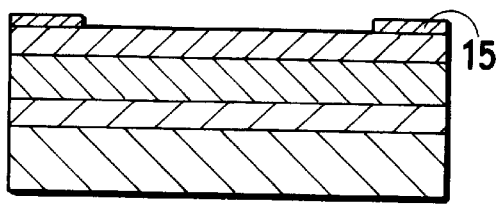
FIG. 10 is a sectional view of a unit having a SIN mask pattern on the periphery.

The processes denoted by FIG. 9 to FIG. 15 are explained. FIG. 9 shows an epitaxial wafer having an n-type InP substrate (11), an InP buffer layer (12), an InGaAs light receiving layer (13) and an InP window layer (14) which have been epitaxially grown on the substrate by the chloride method, the halide method or the MOCVD method. Figures indicate a structure of only one chip in a wafer. The contaminations or oxides on the surface are eliminated by washing the surface of the epitaxial wafer. Then, the wafer is slightly etched back in the epitaxial growth apparatus for activating the epitaxial wafer. For example, 20 nm of the window layer is etched away.

The chloride vapor phase method supplies a chloride of a group V element and hydrogen gas into the reaction apparatus. The chloride is thermally dissolved into hydrochloric acid gas (HCl). The chloride vapor phase method either can grow a thin film on an object or can etch the object by controlling the density of hydrochloric acid gas (HCl). When the HCl density is high, etching prevails. When the HCl density is low, a film grows. Both the film formation and the film elimination can be done in the same reaction apparatus. The chloride method require neither two different reaction apparatuses nor two different sets of gases for etching and depositing. This is a convenient property of the chloride method.

Then, a film of silicon nitride SiN is formed on the overall surface of the washed and etched epitaxial wafer. Holes are perforated on the SiN film at centers of units of devices by using a mask. The holes are circular, elliptical or eccentric holes which shall determine the light receiving regions. The SiN film will act as a mask for diffusing impurity and a mask of forming the undercoating layers of p-electrodes. The openings uncovered with the SiN mask will be covered with the undercoat and will be doped with impurity by the following processes.

Figure 11:
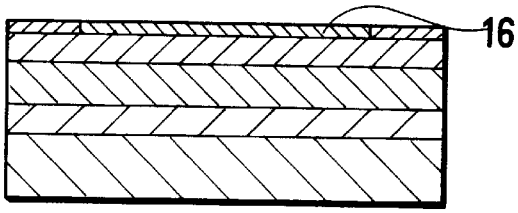
FIG. 11 is a sectional view of a unit having an InGaAs contact (undercoat) layer on an opening of the epitaxial wafer enclosed by the SiN mask.

Zn-free InGaAs layers (16) of a 140 nm (0.14 μm) thickness are selectively grown on the wafer having the SIN mask in a furnace. Since InGaAs cannot grow on SiN, the SiN plays the role of mask. The InGaAs layers (16) are deposited only on the revealed InP window layer. Thus, it is called a selective growth. FIG. 11 shows the selective growth of InGaAs upon the InP. There is no side gap between the InGaAs and the SIN.

Figure 12:
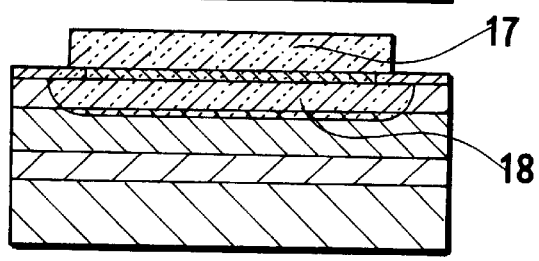
FIG. 12 is a sectional view of a device unit having a InP(Zn) diffusion source on the InGaAs undercoat.

Zn-doped InP film (17) is deposited upon the InGaAs as a solid source of Zn. InP has also an inherent property of selective growth that InP does not grow on SiN but grows on InGaAs. While the InGaAs is growing and after the InGaAs have been grown, Zn atoms diffuse from the InP(Zn) (17) via the InGaAs (16) to the InP window layer (14) and the InGaAs layer (13). FIG.12 indicates the Zn-source (17) and the impurity diffusion region (18). The diffusion region contains the p-InP window layer and the p-InGaAs receiving layer which have been converted from the n-InP and the n-InGaAs. In the embodiment, the Zn-source InP (Zn) (17) has a starting zinc concentration of $2 \times 10^{18} \text{cm}^{-3}$. The Zn-concentration in the InGaAs(Zn) middle layer (16) increases from substantially zero to $1 \times 10^{19} \text{cm}^{-3}$. Such a higher concentration of Zn in the InGaAs results from the higher solid-solubility of Zn and the higher activation of Zn in InGaAs than in InP. Zn atoms slightly penetrate under the mask. The concentration of impurity and the depth of the diffusion can be adjusted by the temperature, the dose of Zn and the time of diffusion.

Figure 13:
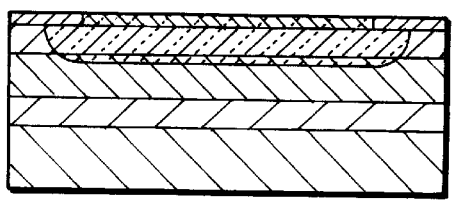
FIG. 13 is a sectional view of a unit from which the diffusion source InP has been removed.
Figure 14:
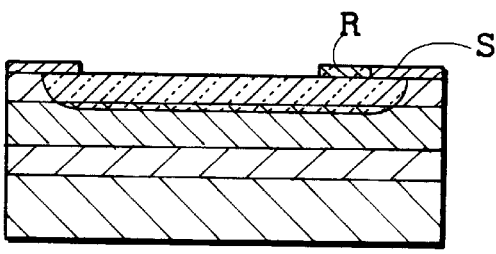
FIG. 14 is a sectional view of a unit in which almost all of the InGaAs layer is etched away except a part for a p-electrode.

When the diffusion has finished, the wafers are taken out of the diffusion furnace. The InP(Zn) (17) Zn-sources are selectively removed from the wafer by an etchant of $HCl:H_2O=1:1$. The etchant is inactive both to InGaAs and SiN. Thus, the etching is called "selective etching." FIG. 13 shows a device unit of the wafer rid of the InP(Zn) (17).

The two ways are quite the same in these steps of FIG. 9–FIG. 13 and FIG. 16–FIG. 19. The two ways are different from each other in the following steps for making p-electrodes on the InGaAs undercoat crystals.

Figure 15:
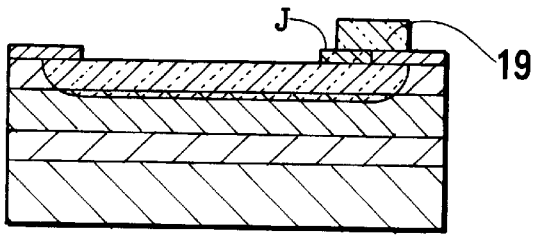
FIG. 15 is a sectional view of a unit having a p-electrode on the InGaAs undercoat.
Figure 16:
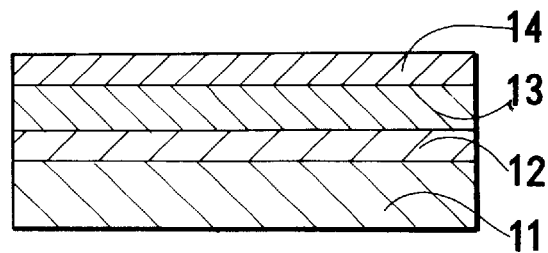
FIG. 16 is a sectional view of a unit of an epitaxial wafer having an n-InP substrate as a starting material of the wafer processes for making a second embodiment by a second embodiment method.
Figure 17:
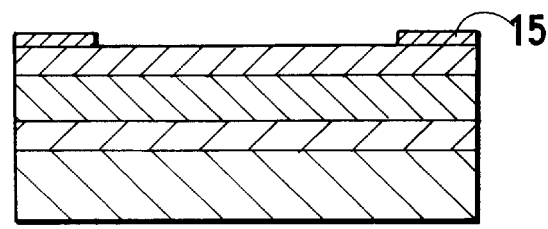
FIG. 17 is sectional view of a unit on which an SiN mask pattern is deposited on the periphery.
Figure 18:
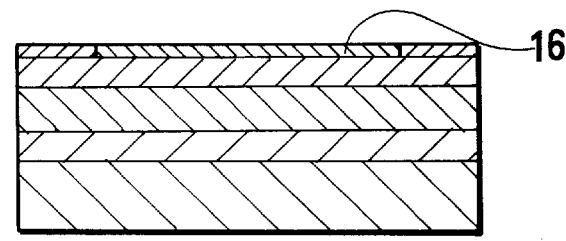
FIG. 18 is a sectional view of a unit provided with an InGaAs undercoat (contact) layer upon the InP window layer enclosed by the SiN.
Figure 19:
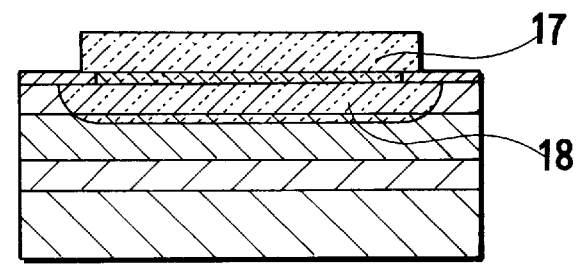
FIG. 19 is a sectional view of a unit having a InP(Zn) diffusion source on the InGaAs layer.

Then, the first way demonstrated by FIG. 9 to FIG. 15 eliminates the undercoat InGaAs layer except for the parts (R) which will be the bases on which p-electrodes are built. Only the parts (R) for electrodes remain on the epitaxial wafer. The remaining parts (R) are annuli or rounds. The shape of the parts (R) is determined by the shape of the electrodes. Since the undercoat is in tight contact with the SiN film, no clearances occur between the remaining undercoat and the SiN. Then, p-electrodes (19) are formed on the rest (R) of InGaAs, as shown by FIG. 15. The p-electrodes have a multilayered structure of (undercoat)/(Au-alloy)/(stopper)/(Au-alloy) from bottom to top. The electrode itself has three-layers of (Au-alloy)/(stopper)/(Au-alloy). The lowest layer is an Au alloy including Zn, Cd, Mg or Be. These p-type impurities diffuse into the epitaxial wafer by heat and form p-regions beneath the electrodes. The p-regions make ohmic contacting electrodes. The middle stopper layer is made from Ti or Cr. The stopper layer prevents p-impurities from diffusing upward. The top Au alloy protects the electrodes from oxidization and enables wirebonding.

The first way of FIG. 9 to FIG. 15 forms p-electrodes on the InGaAs films which have been made in the former step. Thus, the electrodes do not necessarily coincide with the InGaAs layers. Sometimes margins (J) are left on the InGaAs.

Figure 20:
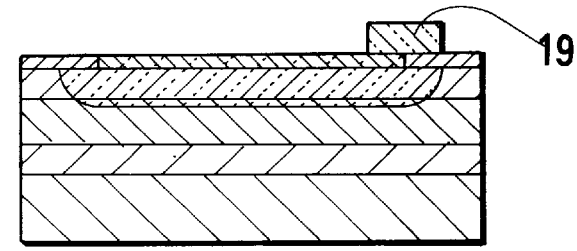
FIG. 20 is a sectional view of a unit having a p-electrode on the Zn-diffused region revealed by removing the InP diffusion source.
Figure 21:
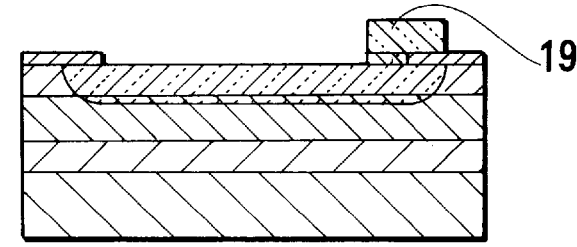
FIG. 21 is a sectional view of unit in which most of the InGaAs layer is etched away by using the p-electrode as a mask.

The second way defined by FIG. 16 to FIG. 21 makes p-electrodes by a more simple process. After the InP(Zn) (17) has been removed, p-electrodes (19) are formed selectively by using a mask upon the InGaAs layer (16), as shown in FIG. 20. Then, the second way takes advantage of the p-electrodes as a mask to etch the undercoat InGaAs layer. Most of the InGaAs is etched away. Only the parts under the p-electrodes are left unetched. The peripheries of the rest of the undercoats coincide with the peripheries of the p-electrodes, as shown by FIG. 21. There is no margin between the undercoats and the electrodes. This result is very effective to enhance the ratio of the light sensitive (receiving) region to the total surface.

Figure 5:
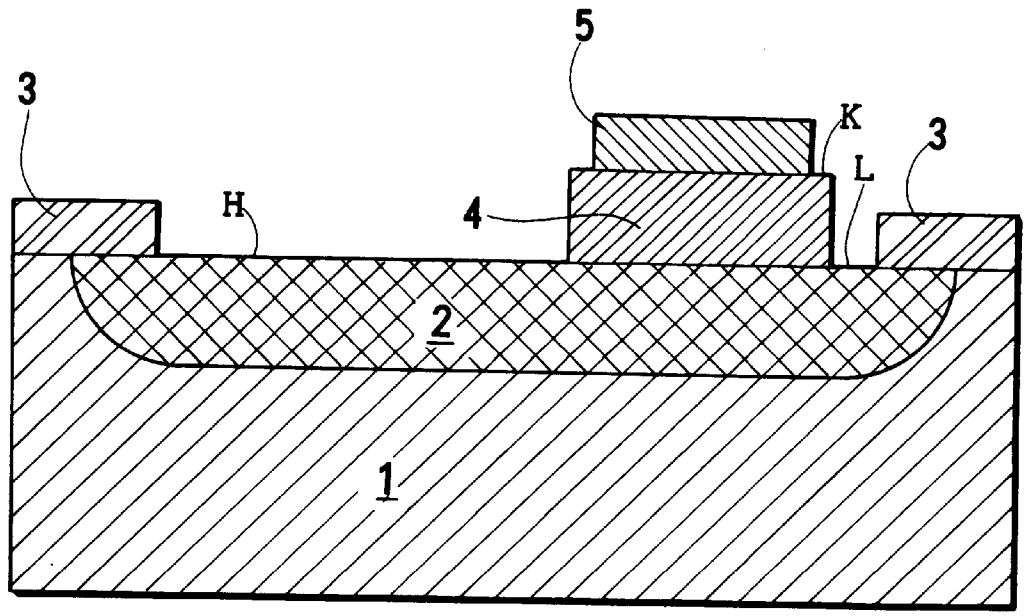
FIG. 5 is a sectional view of a conventional photodiode having a light receiving region with a diameter less than 200 μm.
Figure 6:
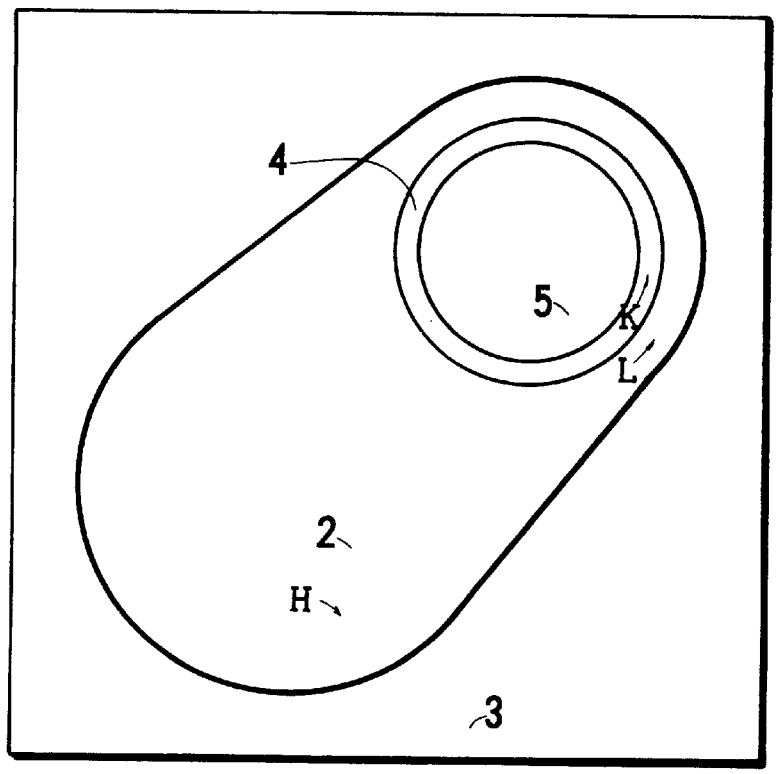
FIG. 6 is a plan view of the same prior photodiode as FIG. 5.
Figure 7:
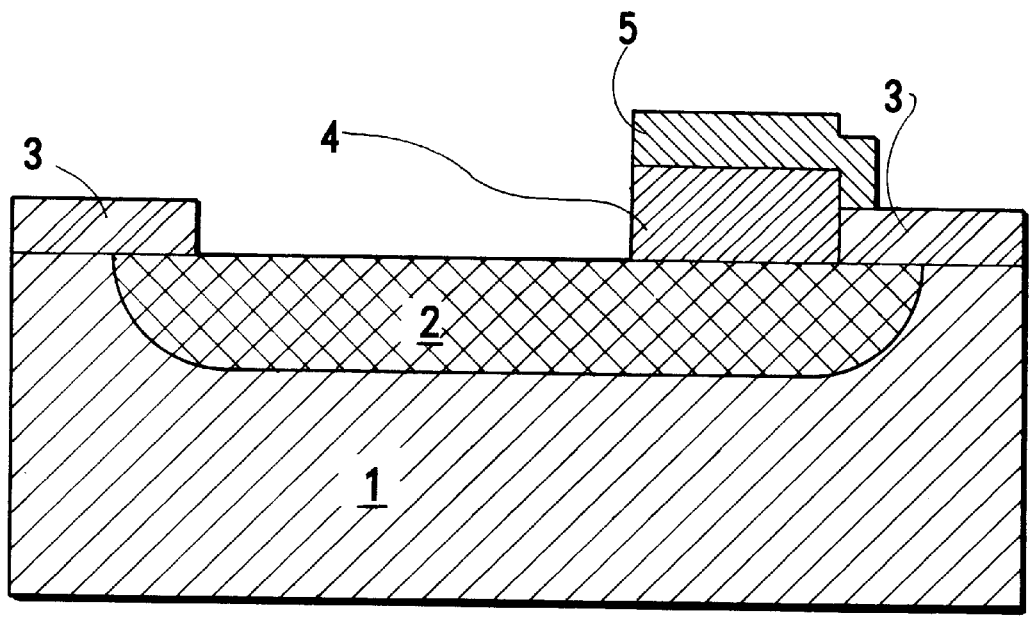
FIG. 7 is a sectional view of another embodiment of the present invention having a light receiving region with a diameter narrower than 200 μm.
Figure 8:
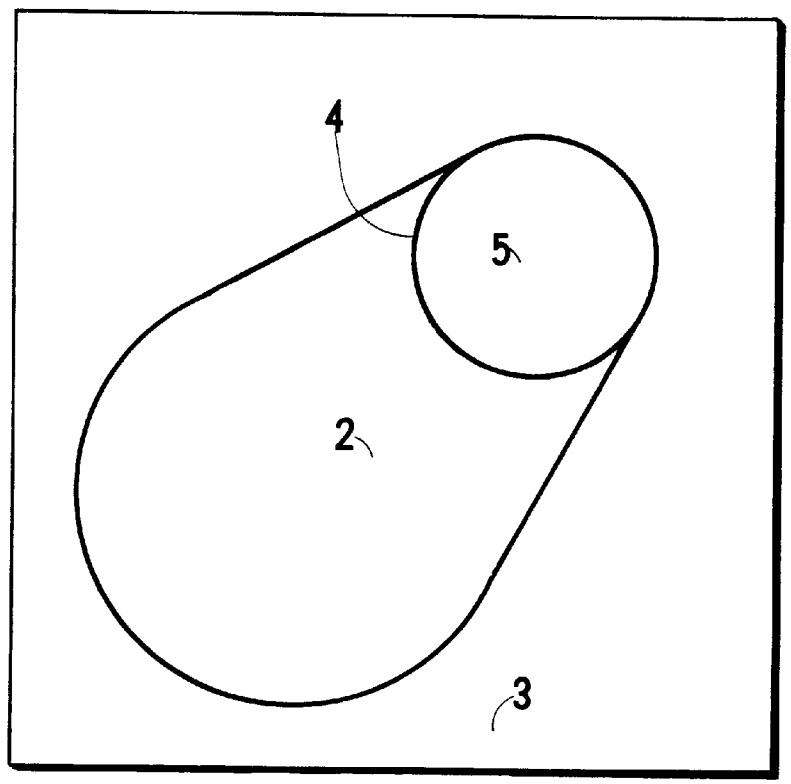
FIG. 8 is a plan view of the same embodiment of photodiode as FIG. 7.

FIG. 7 and FIG. 8 show an embodiment of a photodiode with a diameter smaller than 200 μm which has been made by the steps of FIG. 9–FIG. 15 or FIG. 16–FIG. 21. The sides of the p-electrodes coincide with the sides of the undercoat. The embodiment excels in the area of the sensing region to the prior art of FIG. 5 and FIG. 6 which suffers from the gaps (L) and the margins (K).

[Embodiment ② (large sensing area type using an n-type InP epitaxial wafer)]

Figure 1:
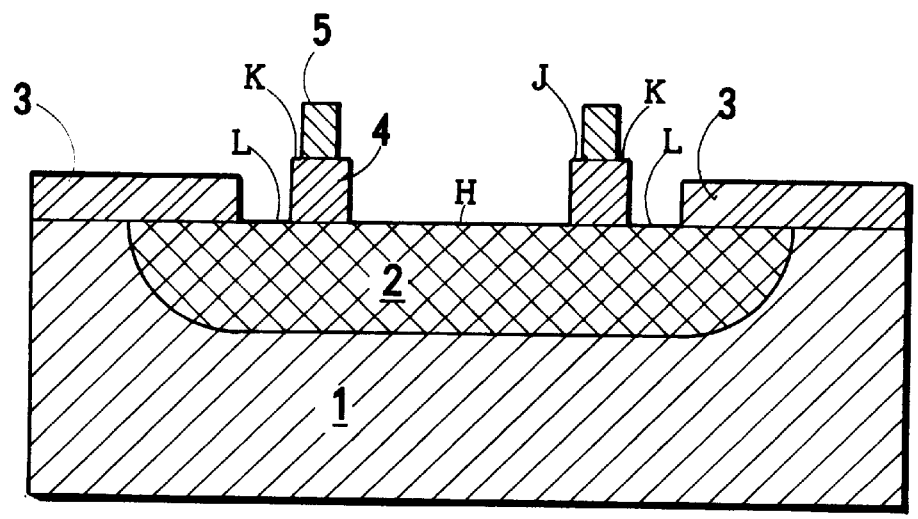
FIG. 1 is a cross-sectional view of a conventional photodiode having a light sensing region whose diameter is more than 200 μm.
Figure 2:
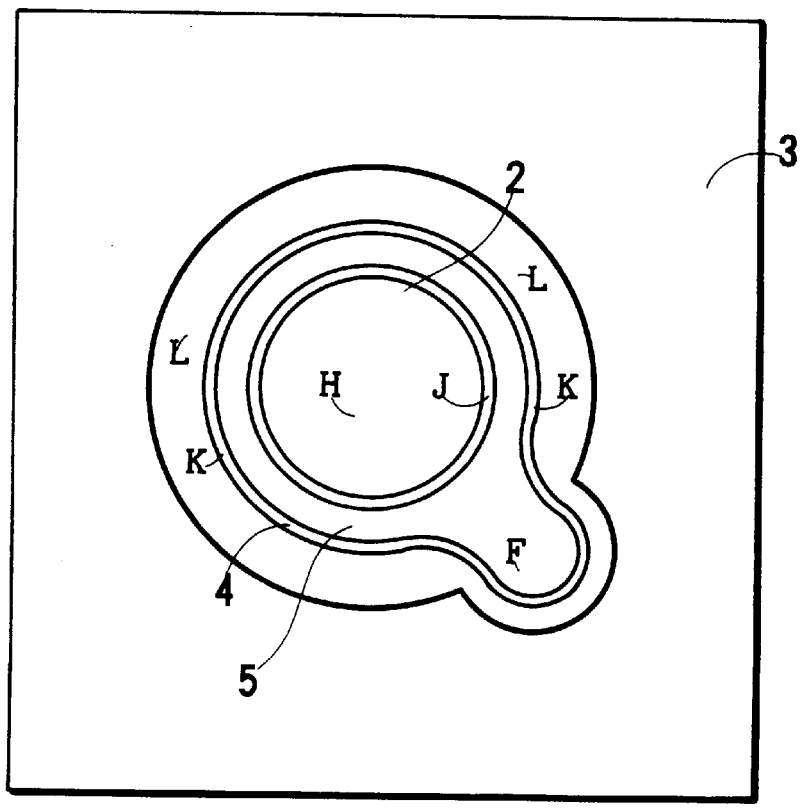
FIG. 2 is a plan view of the conventional photodiode shown in FIG. 1.
Figure 3:
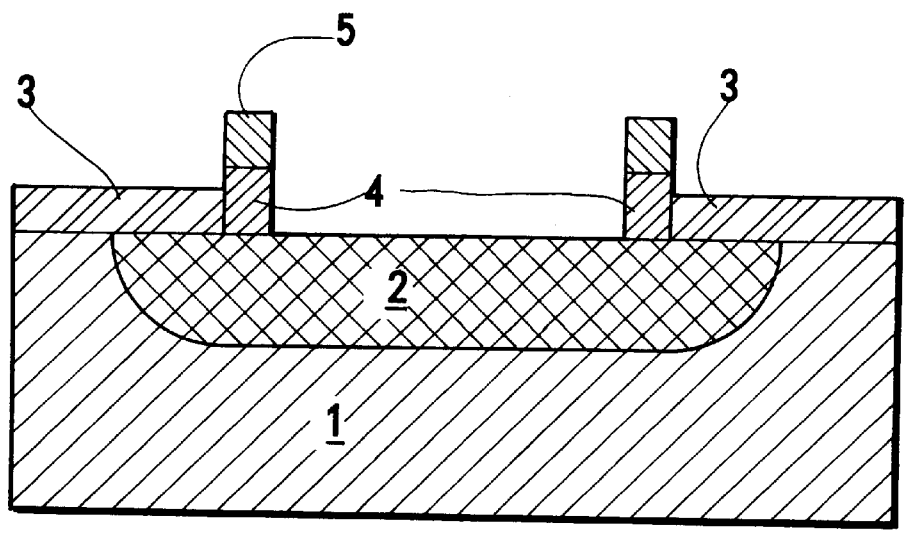
FIG. 3 is a sectional view of a photodiode as an embodiment of the present invention having a light receiving region with a diameter longer than 200 μm.
Figure 4:
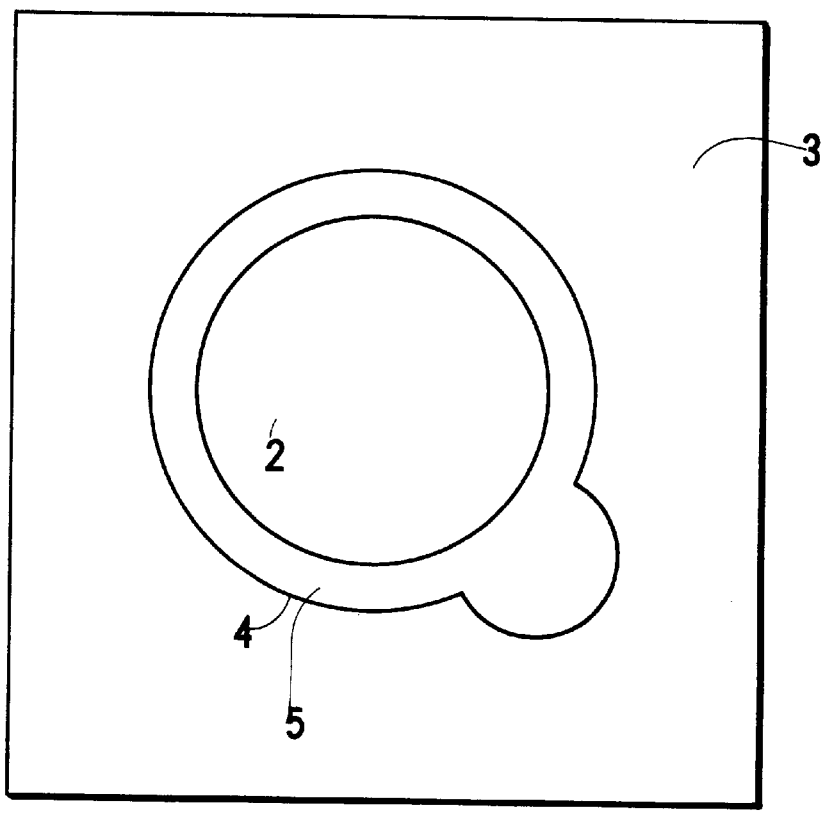
FIG. 4 is a plan view of the same photodiode shown in FIG. 3.

FIG. 3 and FIG. 4 demonstrate another embodiment of a photodiode with a diameter larger than 200 μm. This is obtained by replacing the round undercoats and the electrodes in FIG. 14, FIG. 15, FIG. 20 and FIG. 21 by annular undercoats and annular electrodes. There are no margins on the undercoats. There are no gaps between the InGaAs and the SiN in FIG. 3 and FIG. 4. The effective area of the sensing region is larger than the prior one shown in FIG. 1 and FIG. 2. The embodiment is superior to the prior art in the largeness of the sensing region.

Both embodiments have the undercoats which are in contact with the SIN passivation films. The gaps (L) and margins (K) disappear in the embodiments. Since the areas enclosed by the passivation film are utilized more effectively, this invention is capable of maximizing the sensing areas and minimizing the electrostatic capacitances. In addition, this invention can maintain the quality of the passivation by bringing SiN into a favorable contact with InP instead of InGaAs. The passivation of SiN/InP raises the reliability by suppressing the dark current.

[Embodiment ③ (large sensing area type using a semi-insulating InP substrate)]

Figure 22:
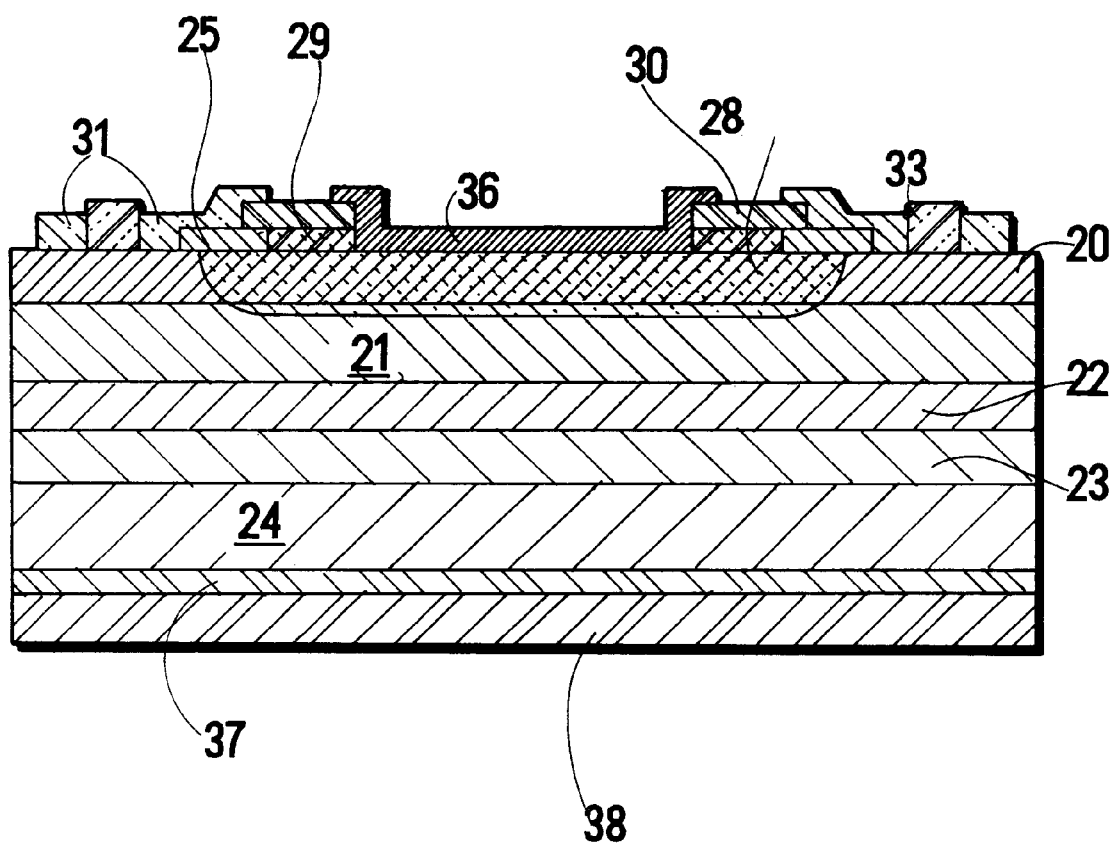
FIG. 22 is a sectional view of a unit of another embodiment of photodiode of the present invention produced upon an epitaxial wafer having a semi-insulating InP substrate.

FIG. 22 shows another embodiment having a large sensing area which is produced by the method of the present invention on an epitaxial wafer including a semi-insulating InP substrate. This embodiment differs from the aforementioned ones in the substrate. Since the substrate is a semi-insulating InP, the position of the n-electrode is different. Other features are similar to the previous embodiments.

Figure 23:
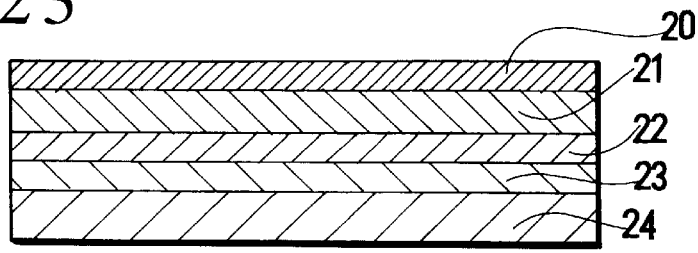
FIG. 23 is a sectional view of a unit of an epitaxial wafer having a semi-insulating InP substrate as a starting material of the wafer process for making a third embodiment by a third embodiment method.

The fabrication is demonstrated by FIG. 23 to FIG. 34. Since a lot of identical photodiode chips are made on a single wafer, only one chip unit is shown in these figures. FIG. 23 is the starting epi-wafer which comprises an InP window layer (20), an InGaAs light receiving layer (21), an n⁻-InP layer (22), an n⁺-InP layer (23) and a semi-insulating InP substrate (24) from top to bottom. The semi-insulating layer (24) has raised the resistivity by doping with iron (Fe). The diameter of the epitaxial wafer is, for example, 2 inches (50 mm). The n⁺-InP (23) has been doped with sulphur (S). The n⁻-InP (22) is non-doped. These epitaxial layers have been grown by the chloride vapor phase method. Of course, this invention can use an epitaxial wafer made by another method, for example, the halide vapor phase method or the metalorganic vapor phase method.

Figure 24:
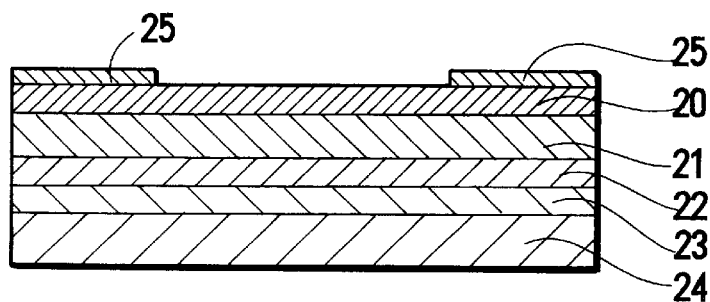
FIG. 24 is sectional view of a unit on which an SiN mask pattern is deposited on the periphery.

FIG. 24 shows the section of a unit of the wafer treated with the processes of coating the InP window layer (20) with a silicon nitride SiN film and eliminating unnecessary central parts of the SiN film. The SiN protection film (25) covers the peripheries of unit devices, leaving the central parts of the InP (20) uncovered.

Figure 25:
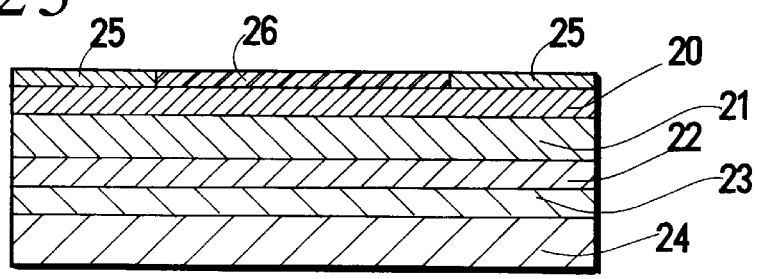
FIG. 25 is a sectional view of a unit provided with an InGaAs undercoat (contact) layer upon the InP window layer enclosed by the SiN.

FIG. 25 demonstrates the section of a unit of the wafer processed with the step of selective deposition of InGaAs layers (26) on the revealed InP window layer (20) by making use of the SiN protection film (25) as a mask. The InGaAs layers (26) will be filters of diffusing Zn. Parts for the InGaAs layers (26) will remain after the diffusion and become undercoats of electrodes.

Figure 26:
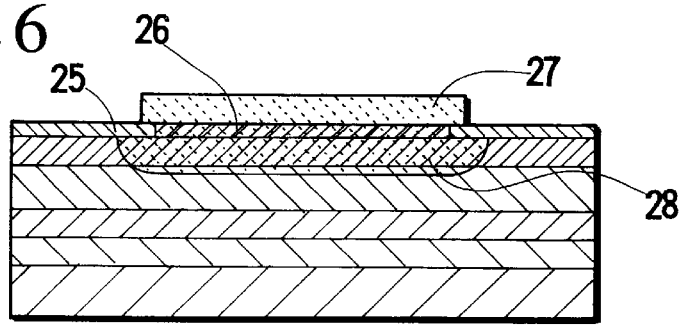
FIG. 26 is a section of a unit having a InP(Zn) diffusion source on the InGaAs layer and having a p-region made by the Zn-diffusion from solid phase.

FIG. 26 is the section of the unit having a Zn diffusion source (27) selectively deposited only on the InGaAs (26). Zn atoms diffuse from the source (27) via the InGaAs solid (26) into the epitaxial wafer to a depth in the InGaAs layer (21). The Zn-diffusion source (27) can be made of any mixture of crystal including Zn. For example, InP(Zn), InAsP(Zn) or InGaAsP(Zn) can be the Zn-source (27). The parts without the SiN mask are converted from an n-type conductivity to a p-type one by the diffusion of Zn atoms. The dish-like parts are called p-regions.

Figure 27:
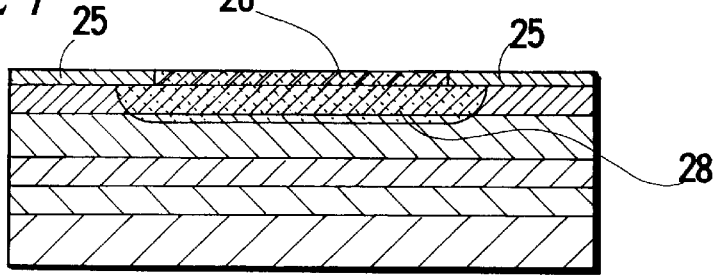
FIG. 27 is a sectional view of a unit from which the InP diffusion source has been eliminated.

FIG. 27 shows a unit of the wafer from which the Zn-diffusion sources have been removed. The central parts of a unit are still covered with the InGaAs layer (26).

Figure 28:
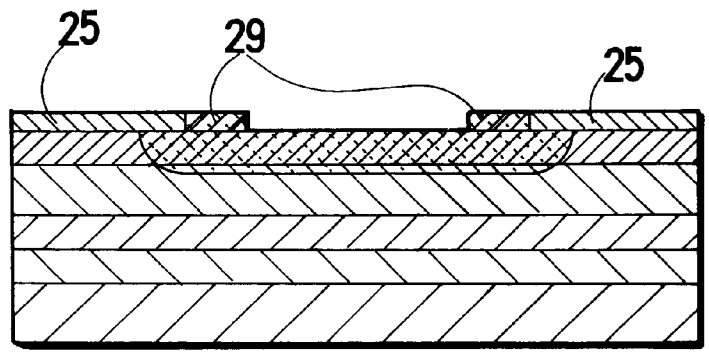
FIG. 28 is a sectional view of a unit in which the central part of the InGaAs layer is eliminated and an annular part is left.

FIG. 28 denotes the state in which the central parts of the InGaAs layer (29) have been etched away. InGaAs annuli remain in contact with the sides of the SiN film (25). The central parts of p-regions are revealed.

Figure 29:
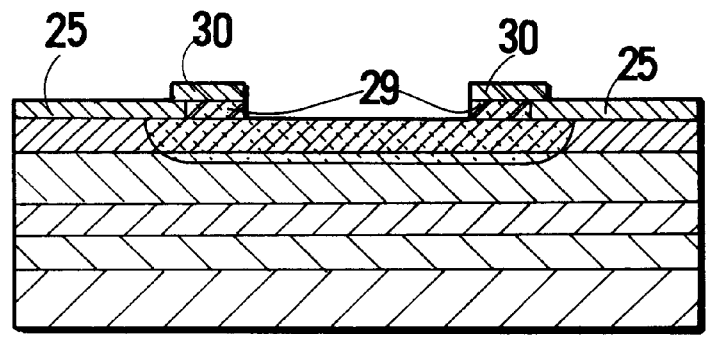
FIG. 29 is a sectional view of a unit having an annular p-electrode formed upon the annular InGaAs undercoat.

Then, ring p-electrodes (30) are formed upon the annular rests of the InGaAs (29) by painting a photoresist on the wafer, removing the parts of the resist for electrodes, evaporating or sputtering an electrode metal on the annular InGaAs (29) through the openings of the resist, alloying the metal with the InGaAS layer (29) and removing the photoresist. FIG.29 shows the section of a unit having the p-electrode (30).

Figure 30:
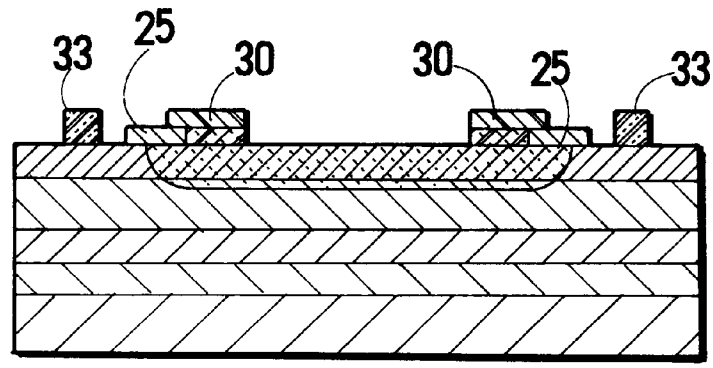
FIG. 30 is a sectional view of a unit in which the peripheral part of the InGaAs has been removed and an annular n-electrode is made upon the revealed periphery of the n-InP window layer.

FIG. 30 denotes a device unit of the wafer from which peripheral parts of the SiN films have been eliminated and annular n-side electrodes (33) are deposited on the revealed peripheries of the n-type InP window layer (20). Thus, the n-electrodes (33) are concentric to the p-electrodes (30). The rests of the SiN (25) are in contact with the InGaAs (29) and the p-electrodes (30) and cover the ends of pn-junctions.

Figure 31:
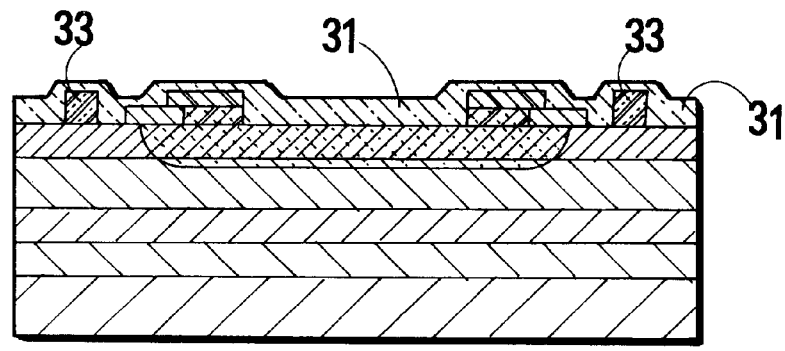
FIG. 31 is a sectional view of a unit having another SiN protection layer covering all the surface.

FIG. 31 demonstrates the step of coating the whole surface of the wafer with a silicon nitride film SiN (31) which has a refractive index different from the SIN (25) protection film. Some conditions are imposed on the refractive index of the new SiN film, because the new SiN film has the role of preventing stray beams from going into the peripheries of the device chip.

Figure 32:
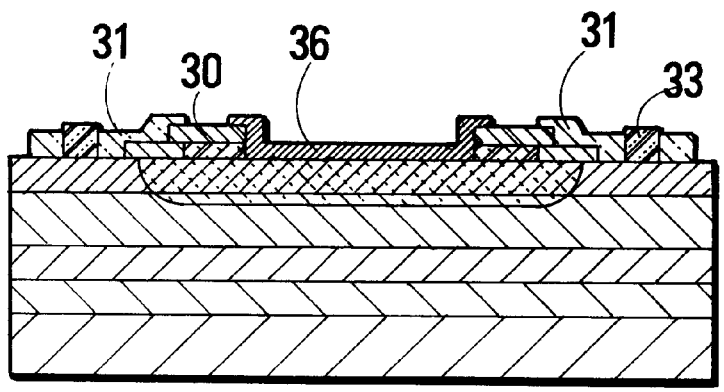
FIG. 32 is a sectional view of a unit in which the SiN has been removed at the central part, at the p-electrode, at the n-electrode and at the periphery of the unit and a new SIN antireflection film has been deposited on the p-region.

Then, the central parts, the parts upon the p-electrodes (30) and the parts on the n-electrodes (33) of the SiN are removed. Then, antireflection films (36) are deposited on the central parts for absorbing all the beams attained, thereby forbidding the surfaces from reflecting the beams. FIG. 32 shows the state at the step. The antireflection films (36) are made from SiN. But the refractive indexes and the thicknesses are different between the central antireflection SIN (36) and the peripheral passivation (protection) SiN (31).

Figure 33:
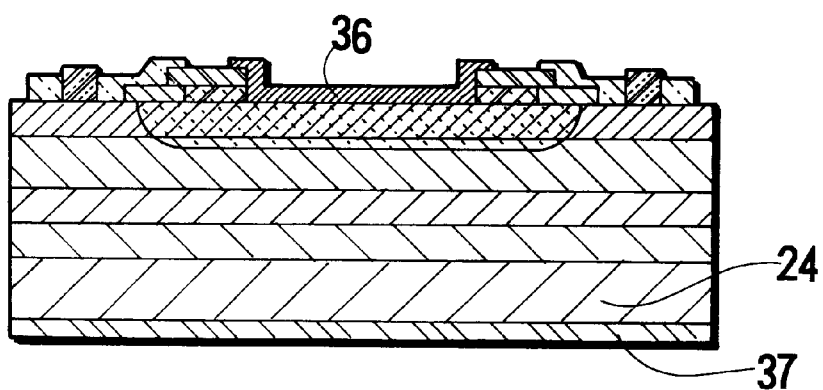
FIG. 33 is a sectional view of a unit having an insulating layer on the bottom surface of the semi-insulating InP substrate.

FIG. 33 denotes a unit of the wafer having an insulating layer (37) on the bottom surface of the semi-insulating InP substrate (24).

Figure 34:
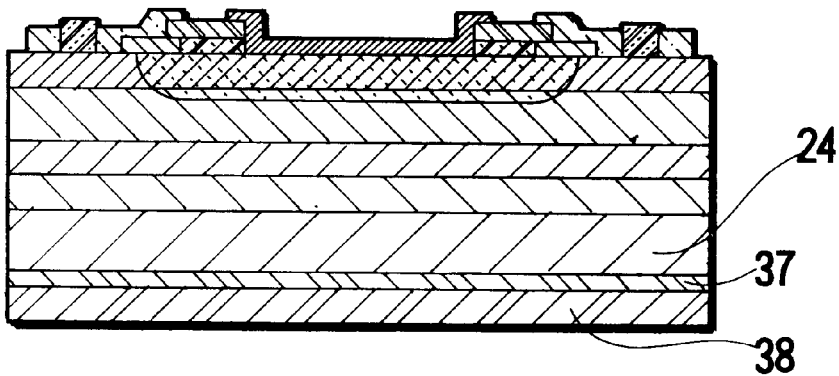
FIG. 34 is a section of a unit having a gluing material on the insulating layer.

FIG. 34 shows the final step of forming a gluing material (38) on the bottom of the insulating layer (37).

Then, the photodiodes shown in FIG. 22 have been produced on a semi-insulating InP wafer according to the teaching of the present invention. This structure also ensures the p-electrodes (30) to be in contact with the peripheral SiN films (31). No spaces remain between the InGaAs undercoat (29) and the SiN insulating layer (25).

The device allows the p-electrodes to be formed at the most outer parts of the openings enclosed by the SiN insulators (31). Wide central parts are left unshielded from the p-electrodes (30) and the InGaAs undercoats (29).

The present invention enables a photodiode having a restricted area to allot a wide area to the sensing region. The wide sensing region enhances the sensitivity of the photodiode. On the other hand, the present invention succeeds in minimizing the electrostatic capacitance, which raises the speed of response. The passivation has been made by an assembly of SiN and InP instead of SiN/InGaAs. The SiN/InP passivation maintains the reliability by suppressing the dark current.

What we claim is:

1. A method of producing a compound semiconductor photodiode comprising the steps of;

depositing a protection film of $SiO_x$ or $Si_xN_y$ on an epitaxial wafer having an n-type InP substrate or a semi-insulating InP substrate and n-type compound semiconductor layers epitaxially grown on the n-type or semi-insulating InP substrate;

forming openings of the protection film on the epitaxial layers by eliminating parts of the protection film;

selectively growing non-doped InGaAs undercoats on the epitaxial layers in the openings of the protection film without accumulating the non-doped InGaAs undercoats on the protection mask by using the protection film as a mask;

growing a solid p-impurity diffusion source of a compound semiconductor including phosphor and a p-impurity on the InGaAs undercoats without accumulating on the protection film by using the protection film as a mask;

diffusing the p-impurity from the solid diffusion source through the InGaAs undercoats into the epitaxial layers during or after the growth of the diffusion source;

making p-regions in the epitaxial layers by the diffusion of the p-impurity;

then producing p-electrodes on the InGaAs undercoats and the protection film and;

then etching parts of undercoats which are not covered with the p-electrodes by using the p-electrodes as a mask.

2. A method as claimed in claim 1, wherein the p-impurity is Zn and the p-impurity diffusion source is InP(Zn), InAsP (Zn) or InGaAsP(Zn).

3. A method as claimed in claim 2, wherein the InGaAs undercoats and the p-impurity diffusion source are grown by a chloride vapor phase method.

4. A method of producing a compound semiconductor photodiode comprising the steps of;

depositing a protection film of $SiO_x$ or $Si_xN_y$ on an epitaxial wafer having an n-type InP substrate or a semi-insulating InP substrate and n-type compound semiconductor layers epitaxially grown on the n-type or semi-insulating InP substrate;

forming openings of the protection film on the epitaxial layers by eliminating parts of the protection film;

selectively growing non-doped InGaAs undercoats on the epitaxial layers in the openings of the protection film without accumulating the non-doped InGaAs undercoats on the protection mask by using the protection film as a mask;

growing a solid p-impurity diffusion source of a compound semiconductor including phosphor and a p-impurity on the InGaAs undercoats without accumulating on the protection film by using the protection film as a mask;

diffusing the p-impurity from the solid diffusion source through the InGaAs undercoats into the epitaxial layers during or after the growth of the diffusion source;

making p-regions in the epitaxial layers by the diffusion of the p-impurity;

then etching the InGaAs undercoats except the parts which will be undercoats of p-electrodes and;

then producing p-electrodes on the remaining InGaAs undercoats.

5. A method as claimed in claim 4, wherein the p-impurity is Zn and the p-impurity diffusion source is InP(Zn), InAsP(Zn) or InGaAsP(Zn).

6. A method as claimed in claim 5, wherein the InGaAs undercoats and the p-impurity diffusion source are grown by a chloride vapor phase method.

7. A method of producing a compound semiconductor photodiode comprising the steps of;

depositing a protection film of SiOx or SixNy on an epitaxial wafer having an n-type InP substrate or a semi-insulating InP substrate and n-type compound semiconductor layers epitaxially grown on the n-type or semi-insulating InP substrate;

forming openings on the epitaxial layers by eliminating parts of the protection film;

growing non-doped InGaAs undercoats on the openings of the n-type semiconductor layers by using the protection film as a mask;

supplying a gas including phosphor (P), arsenic (As) and a p-impurity on the InGaAs undercoats by using the protection film as a mask;

diffusing the p-impurity from vapor phase through the InGaAs undercoats into the epitaxial layers during or after the growth of the diffusion source by heating the wafer;

making p-regions in the epitaxial layers by the diffusion of the p-impurity;

producing p-electrodes on the InGaAs undercoats and;

etching parts of undercoats which are not covered with the p-electrodes by using the p-electrodes as a mask.

8. A method of producing a compound semiconductor photodiode comprising the steps of;

depositing a protection film of SiOx or SixNy on an epitaxial wafer having an n-type InP substrate or a semi-insulating InP substrate and n-type compound semiconductor layers epitaxially grown on the n-type or semi-insulating InP substrate;

forming openings on the epitaxial layers by eliminating parts of the protection film;

growing non-doped InGaAs undercoats on the openings of the n-type semiconductor layers by using the protection film as a mask;

supplying a gas including phosphor (P), arsenic (As) and a p-impurity on the InGaAs undercoats by using the protection film as a mask;

diffusing the p-impurity from vapor phase through the InGaAs undercoats into the epitaxial layers during or after the growth of the diffusion source by heating the wafer;

making p-regions in the epitaxial layers by the diffusion of the p-impurity;

etching the InGaAs undercoats except the parts which will be undercoats of p-electrodes and;

producing p-electrodes on the remaining InGaAs undercoats.

* * * * *